United States Patent
Yoon et al.

(10) Patent No.: US 9,961,809 B1
(45) Date of Patent: May 1, 2018

(54) HEAT RADIATION SHEET AND METHOD FOR MANUFACTURING OF THE SAME

(71) Applicant: SHINWHA INTERTEK CORP, Chungcheongnam-do (KR)

(72) Inventors: Sung Chul Yoon, Gyeonggi-do (KR); Cheol Heung Ahn, Chungcheongnam-do (KR); Dong Hyun Kim, Chungcheongnam-do (KR); Hak-Soo Kim, Chungcheongbuk-do (KR); Su-Han Woo, Daejeon (KR); Jin Go, Chungcheongnam-do (KR); Won Jae Choi, Gyeonggi-do (KR); Dae-Bok Park, Chungcheongnam-do (KR)

(73) Assignee: SHINWHA INTERTEK CORP, Cheonan-si, Chungcheongnam-Do (KR)

( * ) Notice: Subject to any disclaimer, the term of this patent is extended or adjusted under 35 U.S.C. 154(b) by 0 days. days.

(21) Appl. No.: 15/671,038

(22) Filed: Aug. 7, 2017

(30) Foreign Application Priority Data

Oct. 31, 2016 (KR) .................. 10-2016-0142797

(51) Int. Cl.
| H01K 1/58 | (2006.01) |
| H01J 1/02 | (2006.01) |
| H01J 7/24 | (2006.01) |
| H01J 61/52 | (2006.01) |
| H05K 7/20 | (2006.01) |

(Continued)

(52) U.S. Cl.
CPC .......... *H05K 7/20963* (2013.01); *F28F 13/18* (2013.01); *H01L 23/36* (2013.01)

(58) Field of Classification Search
CPC ....... H05K 7/20963; F28F 13/18; H01L 23/36
See application file for complete search history.

(56) References Cited

U.S. PATENT DOCUMENTS

| 8,153,477 B2 * | 4/2012 | Lin | ..................... H01L 21/486 257/711 |
| 9,472,742 B2 * | 10/2016 | Lee | ........................ H01L 33/62 |

FOREIGN PATENT DOCUMENTS

| EP | 2560201 A2 * | 2/2013 | ............ H01L 23/36 |
| JP | 3936134 B2 | 6/2007 | |
| JP | 4051402 B2 | 2/2008 | |

(Continued)

*Primary Examiner* — Donald Raleigh
(74) *Attorney, Agent, or Firm* — Alston & Bird LLP

(57) ABSTRACT

Provided are heat radiation sheet and method of manufacturing the same. The heat radiation sheet comprising: a first protective layer; a first adhesive member which is disposed on the first protective layer and has one or more through holes; a support member which is disposed on the first adhesive member and has one or more through holes; a second adhesive member which is disposed on the support member and has one or more through holes; a heat radiation member which is disposed on the second adhesive member and has one or more through holes; and a third adhesive member which is disposed on the heat radiation member and comprises a base portion contacting a first surface of the heat radiation member and protrusions protruding from the base portion and inserted into the through holes of the heat radiation member, the through holes of the second adhesive member, the through holes of the support member and the through holes of the first adhesive member, wherein the protrusions of the third adhesive member are at least partially coupled to the first protective layer.

17 Claims, 15 Drawing Sheets

(51) Int. Cl.
 *H01L 23/36* (2006.01)
 *F28F 13/18* (2006.01)

(56) References Cited

FOREIGN PATENT DOCUMENTS

| | | |
|---|---|---|
| JP | 2015127372 A | 9/2015 |
| KR | 1020130043720 | 5/2013 |
| KR | 1020140050920 | 4/2014 |
| KR | 1020140145870 | 12/2014 |
| KR | 101500482 | 3/2015 |

\* cited by examiner

HEAT RADIATION SHEET AND METHOD FOR MANUFACTURING OF THE SAME

This application claims priority to Korean Patent Application No. 10-2016-0142797, filed on Oct. 31, 2016, in the Korean Intellectual Property Office, and all the benefits accruing therefrom under 35U.S.C. § 119, the disclosure of which in its entirety is incorporated by reference.

BACKGROUND

1. Field

The present inventive concept relates to a heat radiation sheet and a method of manufacturing the same.

2. Description of the Related Art

Heat may he generated in an electronic device by electronic parts such as wirings, terminals, and chips. Heat generated by electronic parts may shorten the lifetime of electronic devices and cause malfunction and performance degradation. In particular, in the case of a display device having a light source that generates a large amount of heat, the accumulated heat is a major cause of deterioration of the display quality of the display device.

As electronic devices such as display devices and portable terminals become more sophisticated and miniaturized, electronic parts included in the electronic devices are becoming highly integrated, which, in turn, increases heat density. Therefore, there is a need for a technology that can effectively remove generated heat.

As an example method of removing the heat, a heat radiation sheet including a heat radiation member may be placed adjacent to an electronic part that generates heat.

SUMMARY

Aspects of the inventive concept provide a heat radiation sheet having an improved heat dissipation function and superior bending characteristics and durability.

Aspects of the inventive concept also provide a method of manufacturing a heat radiation sheet having an improved heat dissipation function and superior bending characteristics and durability.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an exemplary embodiment of the invention, there is provided a heat radiation sheet. The heat radiation sheet comprising: a first protective layer; a first adhesive member which is disposed on the first protective layer and has one or more through holes; a support member which is disposed on the first adhesive member and has one or more through holes; a second adhesive member which is disposed on the support member and has one or more through holes; a heat radiation member which is disposed on the second adhesive member and has one or more through holes; and a third adhesive member which is disposed on the heat radiation member and comprises a base portion contacting a first surface of the heat radiation member and protrusions protruding from the base portion and inserted into the through holes of the heat radiation member, the through holes of the second adhesive member, the through holes of the support member and the through holes of the first adhesive member, wherein the protrusions of the third adhesive member are at least partially coupled to the first protective layer.

In an exemplary embodiment, wherein the through holes of the first adhesive member, the through holes of the support member, the through holes of the second adhesive member, and the through holes of the heat radiation member may be connected to each other.

In an exemplary embodiment, a thickness of the first protective layer may be greater than a thickness of the support member and smaller than a thickness of the heat radiation member, a thickness of the base portion of the third adhesive member may be greater than the sum of a thickness of the first adhesive member and a thickness of the second adhesive member, thermal conductivity of the heat radiation member in a horizontal direction may be greater than thermal conductivity of the first protective layer, and the thermal conductivity of the first protective layer may be greater than thermal conductivity of the support member.

In an exemplary embodiment, the heat radiation member may comprise a carbon material, and the first protective layer comprises copper (Cu), aluminum (Al), silver (Ag), gold (Au), carbon nanotubes, graphene, or a polymer film.

In an exemplary embodiment, the first adhesive member and the second adhesive member may comprise thermosetting resin, and the third adhesive member comprises photocurable resin.

In an exemplary embodiment, a modulus of the third adhesive member may be greater than a modulus of the first adhesive member and a modulus of the second adhesive member.

In an exemplary embodiment, the protrusions of the third adhesive member may contact the first adhesive member.

In an exemplary embodiment, the hrough holes of the heat radiation member may be arranged regularly on a plane.

In an exemplary embodiment, a planar area of each through hole of the heat radiation member in the first surface of the heat radiation member facing the third adhesive member may be greater than a planar area of each through hole of the heat radiation member in a second surface of the heat radiation member facing the second adhesive member.

In an exemplary embodiment, the planar area of each through hole of the heat radiation member in the second surface of the heat radiation member facing the second adhesive member may be greater than a planar area of each through hole of the first adhesive member in a second surface of the first adhesive member facing the first protective layer.

In an exemplary embodiment, the heat radiation sheet may further comprise a second protective layer which is disposed on the third adhesive member, wherein gloss of a second surface of the second protective layer facing the third adhesive member is equal to gloss of a first surface of the first protective layer facing the first adhesive member.

In an exemplary embodiment, the heat radiation sheet may further comprise a second protective layer which is disposed on the third adhesive member, wherein gloss of a second surface of the second protective layer facing the third adhesive member is smaller than gloss of a first surface of the first protective layer facing the first adhesive member.

In an exemplary embodiment, the heat radiation sheet may further comprise: a second protective layer which is disposed on the third adhesive member; and a metal particle layer which is disposed on a second surface of the second protective layer facing the third adhesive member.

According to another exemplary embodiment of the invention, there is provided a heat radiation sheet. The heat radiation sheet comprising: a protective layer; a first adhesive member which is disposed on the protective layer and has one or more through holes; a heat radiation member which is disposed on the first adhesive member and has one or more through holes; and a second adhesive member which is disposed on the heat radiation member and comprises a base portion contacting a first surface of the heat radiation member and protrusions protruding from the base portion and inserted into the through holes of the heat radiation member and the through holes of the first adhesive member, wherein the first adhesive member and the second adhesive member are made of different materials, wherein the protrusions of the second adhesive member are at least partially coupled to the protective layer.

According to an exemplary embodiment of the invention, there is provided a method of manufacturing a heat radiation sheet. The method comprising: preparing a carrier film, a first adhesive member disposed on a first surface of the carrier film, and a heat radiation member disposed on a first surface of the first adhesive member; forming one or more through holes in each of the heat radiation member and the first adhesive member; removing the carrier film and placing a first protective layer on a second surface of the first adhesive member; and placing a second adhesive member on the heat radiation member such that the second adhesive member contacts the first protective layer and the heat radiation member, wherein the second adhesive member is at least partially coupled to the first protective layer.

In an exemplary embodiment, the placing of the second adhesive member may comprise: providing a composition for forming the second adhesive member on a first surface of the heat radiation member; filling the through holes of the heat radiation member with the composition; and forming the second adhesive member by curing the composition.

In an exemplary embodiment, may further comprise: placing a release film on the first surface of the second adhesive member; pressing the first protective layer, the first adhesive member, the heat radiation member, the second adhesive member, and the release film; exposing the first surface of the second adhesive member by removing the release film; and placing a second protective layer on the first surface of the second adhesive member, wherein the placing of the release film, the pressing of the release film, the removing of the release film, and the placing of the second protective layer are performed using a roll-to-roll process.

A heat radiation sheet according to an embodiment can have superior heat dissipation characteristics and improved bending characteristics. In addition, even when a graphite sheet is used as a heat radiation member, interlaminar adhesion of the graphite sheet can be increased, thereby giving excellent physical and mechanical properties to the heat radiation sheet and improving the reliability of the heat radiation sheet.

A method of manufacturing a heat radiation sheet according to an embodiment is performed using a roll-to-roll process. Therefore, the manufacturing process can be simplified, and the manufacturing cost can be reduced.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
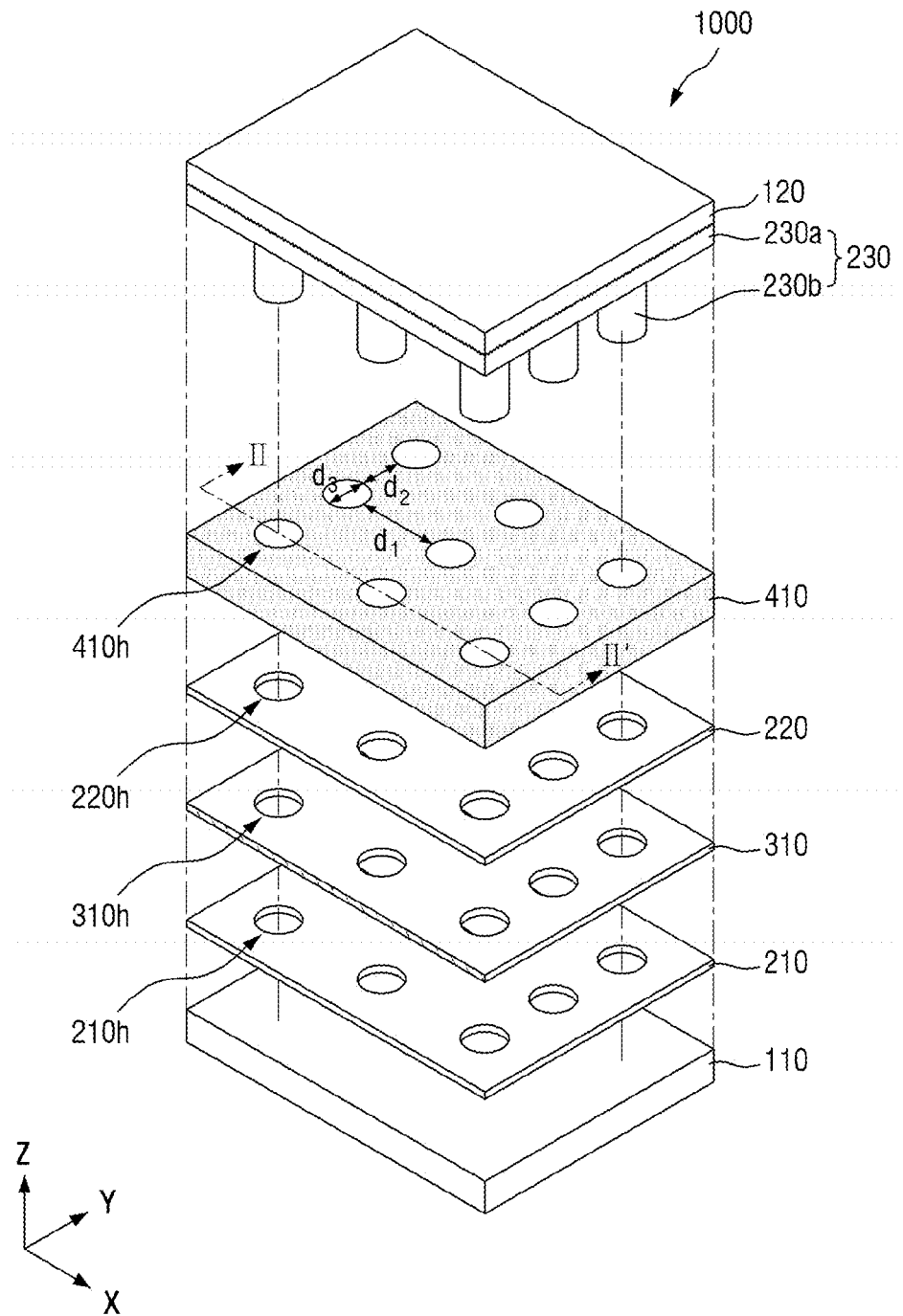
FIG. 1 is an exploded perspective view of a heat radiation sheet according to an embodiment.

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically and/or fluidly connected to each other.

Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

The terms "sheet," "film," and "plate" used herein have the same meaning and can be used interchangeably. In this specification, a first direction X is any one direction in a plane, a second direction Y is a direction intersecting the first direction X in the plane, and a third direction Z is a direction perpendicular to the plane.

Hereinafter, embodiments of the inventive concept will be described with reference to the accompanying drawings.

Figure 2:
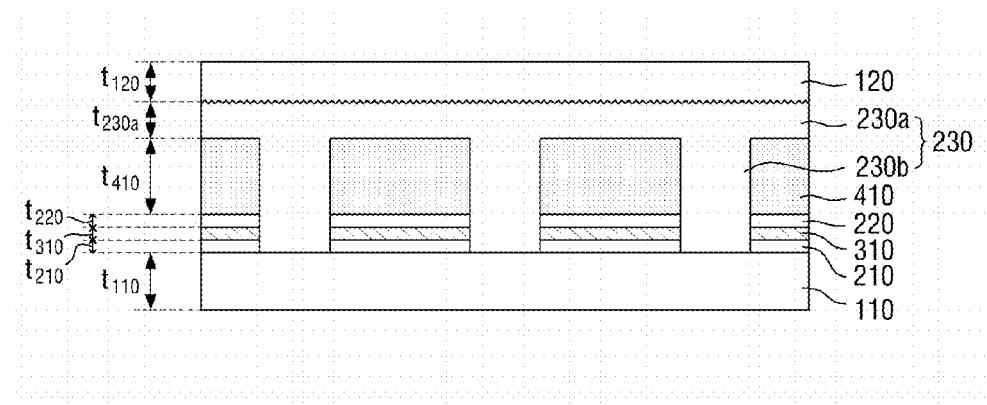
FIG. 2 is a cross-sectional view taken along the line II-II' of FIG. 1.

FIG. 1 is an exploded perspective view of a heat radiation sheet 1000 according to an embodiment. FIG. 2 is a cross-sectional view taken along the line II-II' of FIG. 1.

Referring to FIGS. 1 and 2, the heat radiation sheet 1000 according to the current embodiment includes a first protective layer 110, a first adhesive member 210 disposed on the first protective layer 110, a support member 310 disposed on the first adhesive member 210, a second adhesive member 220 disposed on the support member 310, a heat radiation member 410 disposed on the second adhesive member 220, a third adhesive member 230 disposed on the heat radiation member 410, and a second protective layer 120 disposed on the third adhesive member 230.

The first protective layer 110 and the second protective layer 120 may be protective members that support the heat radiation member 410 to minimize damage due to an external impact and to prevent the penetration of impurities, such as moisture, into the heat radiation sheet 1000. The first protective layer 110 and the second protective layer 120 may be made of a material having a relatively high thermal conductivity. That is, the first protective layer 110 and the second protective layer 120 may be heat transfer members as well as protective members. For example, each of the first protective layer 110 and the second protective layer 120 may be made of a metal material such as copper (Cu), aluminum (Al), silver (Ag), gold (Au) or an alloy of the same or may be made of carbon nanotubes or graphene. Another example of each of the first protective layer 110 and the second protective layer 120 may be a polymer film such as polyethylene terephthalate. In an exemplary embodiment, the thermal conductivity of each of the first protective layer 110 and the second protective layer 120 may be equal to or greater than about 100 W/mK. The first protective layer 110 and the second protective layer 120 may be made of a material having a relatively high thermal conductivity to further improve heat dissipation characteristics of the heat radiation sheet 1000. A maximum thickness $t_{110}$ of the first protective layer 110 and a maximum thickness $t_{120}$ of the second protective layer 120 may each be, but are not limited to, about 7 to 7.5 micrometer(μm) or about 7 to 36 μm.

In an exemplary embodiment, the surface roughness of a second surface (a lower surface in the drawings) of the second protective layer 120 which faces the third adhesive member 230 may be greater than that of a first surface (an upper surface in the drawings) of the first protective layer 110 which faces the first adhesive member 210. In a method of manufacturing a heat radiation sheet which will be described later, an attachment surface of the first protective layer 110 attached using a sheet type adhesive member may be formed to have a relatively small surface roughness, and an attachment surface of the second protective layer 120 attached using a composition for forming an adhesive member may be formed to have a relatively large surface roughness, thereby improving the durability of the heat radiation sheet 1000.

The surface gloss of the second surface of the second protective layer 120 which faces the third adhesive member 230 may be smaller than the gloss of the first surface of the first protective layer 110 which faces the first adhesive member 210. As used herein, the term "gloss" denotes a ratio of the amount of regularly reflected light to the amount of light incident at an angle of 60 degrees to a reflective surface. The gloss may have a smaller value as the surface roughness is greater. For example, the gloss of the second surface (the lower surface in the drawings) of the second protective layer 120 may be about 50 or less, about 20 or less, or about 10 or less. If the gloss of the second surface of the second protective layer 120 is less than 50, the surface roughness of the second surface of the second protective layer 120 may be made sufficiently high, thereby improving the durability of the heat radiation sheet 1000. In addition, the gloss of the first surface of the first protective layer 110 may be greater than the gloss of the second surface of the second protective layer 120 by about 20 or more.

The heat radiation member 410 is interposed between the first protective layer 110 and the second protective layer 120. The heat radiation member 410 may be a heat transfer member made of a material having a relatively high thermal conductivity. In an exemplary embodiment, the thermal conductivity of the heat radiation member 410 in a thickness direction (the third direction Z) may be different from the thermal conductivity of the heat radiation member 410 in a horizontal direction (the first direction X and the second direction Y). For example, the thermal conductivity of the heat radiation member 410 may be greater in the horizontal direction than in the thickness direction. Accordingly, the heat transferred from the outside can be effectively transmitted in the horizontal direction (a plane direction). In an exemplary embodiment, the magnitude of the thermal conductivity of the heat radiation member 410 in the horizontal direction may be at least about 20 times the magnitude of the thermal conductivity of the heat radiation member 410 in the thickness direction. For example, the thermal conductivity of the heat radiation member 410 in the horizontal direction may be about 450 W/mK, and the thermal conductivity of the heat radiation member 410 in the thickness direction may be about 15 W/mK.

In addition, the thermal conductivity of the heat radiation member 410 may be greater than the thermal conductivity of the first protective layer 110 and the thermal conductivity of the second protective layer 120. For example, the thermal conductivity of the heat radiation member 410 in the horizontal direction may be greater than the thermal conductivity of the first protective layer 110 and the thermal conductivity of the second protective layer 120.

The heat radiation member 410 may include a carbon material such as graphite, graphene, or carbon nanotubes. In an exemplary embodiment, the heat radiation member 410 may be a graphite film obtained by carbonizing and graphitizing a polymer film such as polyimide. Due to its excellent thermal conductivity, the graphite can further improve the heat dissipation characteristics of the heat radiation sheet 1000 when applied as the heat radiation member 410. In addition, artificial graphite produced by carbonizing and graphitizing a polymer film can make the heat radiation sheet 1000 thin because it can be formed to a micro-sized thickness. When the artificial graphite is applied as the heat radiation member 410, the adhesive strength of the heat radiation member 410 in the thickness direction may he smaller than the adhesive or adhesive strength of the first adhesive member 210.

A thickness $t_{410}$ of the heat radiation member 410 may be greater than the maximum thickness $t_{110}$ of the first protective layer 110 and the maximum thickness $t_{120}$ of the second protective layer 120. For example, the thickness $t_{410}$ of the heat radiation member 410 may be about 17 to 40 μm. In an embodiment, the heat radiation member 410 may be natural graphite.

The heat radiation member 410 has one or more first through holes 410h. Protrusions 230b of the third adhesive member 230 which will be described later may be inserted into the first through holes 410h. The first through holes 410h may be regularly arranged on a plane. In this specification, the phrase "on a plane" or "a planar viewpoint" refers to a case where an object is viewed in the third direction Z in the drawings. In an exemplary embodiment, the first through holes 410h of the heat radiation member 410 may be separated from each other in the first direction X and the second direction Y, which are orthogonal to each other on a plane, and may be arranged in a substantially matrix shape. A distance $d_1$ between the first through holes 410h in the first direction X may be different from a distance $d_2$ between the first through holes 410h in the second direction Y. For example, the distance $d_1$ between the first through holes 410h in the first direction X may be about 15 to 30 mm, the distance $d_2$ between the first through holes 410h in the second direction Y may be about 5 to 20 mm, and the distance $d_1$ in the first direction X may be greater than the distance $d_2$ in the second direction Y Since the first through holes 410h are substantially regularly arranged on a plane, the thermal conductivity of the heat radiation member 410 in the horizontal direction can be uniformly maintained. In an embodiment, the distance $d_1$ between the first through holes 410h in the first direction X may be substantially equal to the distance $d_2$ between the first through holes 410h in the second direction Y.

The planar shape of each of the first through holes 410h is not particularly but may be, for example, substantially circular. In an embodiment, the planar shape of each of the first through holes 410h may be oval or polygonal. In this specification, the planar shape of a through hole denotes the cross-sectional shape of the through hole taken along a direction perpendicular to the third direction Z. When the first through holes 410h are circular, a diameter $d_3$ of each of the first through holes 410h may be smaller than the distances $d_1$ and $d_2$ in the first direction X and the second direction Y For example, the diameter $d_3$ of each of the first through holes 410h may be about 2 to 6 millimeter(m).

The first through holes 410h may extend in substantially the third direction Z (the thickness direction). The planar area of each of the first through holes 410h may be substantially uniform regardless of position in the third direction Z. In this specification, the planar area of a through hole refers to the area of a figure having a shape corresponding to the planar shape of the through hole. For example, the planar area of each of the first through holes 410h in a first surface (an upper surface in the drawings) of the heat radiation member 410 which faces the third adhesive member 230 may be substantially equal to the planar area. of each of the first through holes 410h in a second surface (a lower surface in the drawings) of the heat radiation member 410 which faces the second adhesive member 220. In addition, inner walls of the first through holes 410h may be substantially perpendicular to any one surface of the heat radiation member 410. However, in an embodiment, the first through holes 410h may be inclined.

The first adhesive member 210 may be disposed between the first protective layer 110 and the heat radiation member 410 to be in direct contact with the first protective layer 110. In addition, the second adhesive member 220 may be disposed between the first protective layer 110 and the heat radiation member 410 to be in direct contact with the heat radiation member 410. Each of the first adhesive member 210 and the second adhesive member 220 may include a material having adhesive or adhesive strength. The first adhesive member 210 and the second adhesive member 220 can bond the first protective layer 110 to the second surface (the lower surface in the drawings) of the heat radiation member 410. The first protective layer 110 attached onto the second surface of the heat radiation member 410 can improve heat transfer characteristics and/or durability of the heat dissipating sheet 1000. Also, for example, even when the heat radiation member 410 is made of a material that is susceptible to damage in the third direction Z and is easily peeled off, the first protective layer 110 can improve the internal adhesion in the vicinity of the second surface (the lower surface in the drawings) of the heat radiation member 410 facing the first protection layer 110 and give excellent physical and mechanical properties to the heat radiation sheet 1000.

In addition, the support member 310 may be disposed between the first adhesive member 210 and the second adhesive member 220 to be in direct contact with the first adhesive member 210 and the second adhesive member 220. In the method of manufacturing a heat radiation sheet which will be described later, the support member 310 can make it easy to form the first through holes 410h of the heat radiation member 410 and second through fourth through holes 220h, 310h and 210h which will be described later.

A thickness $t_{310}$ of the support member 310 may be smaller than the maximum thickness $t_{110}$ of the first protective layer 110 and the maximum thickness $t_{120}$ of the second protective layer 120. In addition, a thickness $t_{210}$ of the first adhesive member 210 and a thickness $t_{220}$ of the second adhesive member 220 may both be smaller than the maximum thickness $t_{110}$ of the first protective layer 110 and the maximum thickness $t_{120}$ of the second protective layer 120. For example, the thickness $t_{210}$ of the first adhesive member 210, the thickness $t_{220}$ of the second adhesive member 220, and the thickness $t_{310}$ of the support member 310 may each be about 0.5 to 2 μm. The thermal conductivity of the support member 310 may be smaller than those of the first protective layer 110, the second protective layer 120, and the heat radiation member 410. The support member 310 can be made of any material as long as it is more rigid than the first adhesive member 210 and the second adhesive member 220. For example, the support member 310 may be a polymer film such as polyethylene terephthalate (PET). The first adhesive member 210 and the second adhesive member 220 may include thermosetting resin.

Unlike the illustration in the drawings, the support member 310 and the second adhesive member 220 may be omitted in an embodiment. In this case, the first adhesive member 210 may directly contact both the first protective layer 110 and the heat radiation member 410 to bond the first protective layer 110 and the heat radiation member 410 together.

The second adhesive member 220 has one or more second through holes 220*h*, the support member 310 has one or more third through holes 310*h*, and the first adhesive member 210 has one or more fourth through holes 210*h*. The protrusions 230*b* of the third adhesive member 230 to be described later may be inserted into the second through holes 220*h*, the third through holes 310*h* and the fourth through holes 210*h*. The first through holes 410*h* of the heat radiation member 410, the second through holes 220*h* of the second adhesive member 220, the third through holes 310*h* of the support member 310 and the fourth through holes 210*h* of the first adhesive member 210 may be connected to each other. The second through fourth through holes 220*h*, 310*h* and 210*h* may be regularly arranged on a plane, and the planar shape, size and arrangement of the second through fourth through holes 220*h*, 310*h* and 210*h* may be substantially the same as those of the first through holes 410*h*. The second through fourth through holes 220*h*, 310*h* and 210*h* may extend in substantially the third direction Z, and respective inner walls of the second through fourth through holes 220*h*, 310*h* and 210*h* may be substantially perpendicular to the first surface of the first protective layer 110.

The third adhesive member 230 may be disposed on the heat radiation member 410. In an exemplary embodiment, the third adhesive member 230 includes a base portion 230*a*. which is disposed on the heat radiation member 410 to contact the first surface (the upper surface in the drawings) of the heat radiation member 410 and one or more protrusions 230*b* which protrude from the base portion 230*a* to a side (a lower side in the drawings) in the third direction Z and are inserted into the first through fourth through holes 410*h*, 220*h*, 310*h* and 210*h*. The base portion 230*a* and the protrusions 230*b* may be integrally formed with each other without a physical boundary.

The base portion 230*a* and the protrusions 230*b* of the third adhesive member 230 may all include a material having adhesive or adhesive strength. In an exemplary embodiment, the third adhesive member 230 may be made of a material different from the first adhesive member 210 and the second adhesive member 220. For example, the third adhesive member 230 may include a material having greater bonding or adhesive strength than the first adhesive member 210. In another example, the third adhesive member 230 may include photocurable resin. The third adhesive member 230 may be made of photocurable resin to minimize the volume lost during a curing process. Accordingly, the protrusions 230*b* can be inserted completely into the through holes. The viscosity of the third adhesive member 230 may be in the range of about 100 to 10,000 cps, about 100 to 5,000 cps, or about 1,000 to 5,000 cps. In the method of manufacturing a heat radiation sheet which will be described later, the third adhesive member 230 may be formed to have a relatively low viscosity so as to make it easy to form the protrusions 230*b* of the third adhesive member 230. The thermal conductivity of the third adhesive member 230 may be smaller than the thermal conductivity of the heat radiation member 410.

The modulus of the third adhesive member 230 may be greater than the modulus of the first adhesive member 210 and the modulus of the second adhesive member 220. In addition, a minimum thickness tnoa of the base portion 230*a* of the third adhesive member 230 may be greater than the sum $(t_{210}+t_{220})$ of the thickness $t_{210}$ of the first adhesive member 210 and the thickness $t_{220}$ of the second adhesive member 220. Since the base portion 230*a* of the third adhesive member 230 having a relatively large modulus is formed to have a sufficient thickness, bending characteristics of the heat radiation sheet 1000 can be improved. In particular, the first adhesive member 210 and the second adhesive member 220 are disposed on a first side (a lower side in the drawings) of the heat radiation member 410, the base portion 230*a* of the third adhesive member 230 is disposed on a second side (an upper side in the drawings) of the heat radiation member 410, and the protrusions 230*b* penetrating the heat radiation member 410 are connected to the base portion 230*a*. Accordingly, the minimum thickness $t_{230a}$ of the base portion 230*a* of the third adhesive member 230 is made greater than the sum $(t_{210}+t_{220})$ of the thickness $t_{210}$ of the first adhesive member 210 and the thickness $t_{220}$ of the second adhesive member 220, thereby further improving the bending characteristics. For example, the minimum thickness $t_{230a}$ of the base portion 230*a* of the third adhesive member 230 may be about 3 to 6 μm.

In some embodiments, the third adhesive member 230 may include a plurality of thermally conductive particles (not illustrated) dispersed therein. That is, the base portion 230*a* and the protrusions 230*b* of the third adhesive member 230 may include a material having adhesive or bonding strength and a plurality of thermally conductive particles dispersed therein. The thermally conductive particles can give heat transfer characteristics to the third adhesive member 230 and further improve the heat transfer characteristics of the heat radiation sheet 1000. Examples of the thermally conductive particles include metal particles, particles made of a carbon material, and particles made of a polymer material.

The base portion 230*a* of the third adhesive member 230 may bond the second protective layer 120 to the first surface (the upper surface in the drawings) of the heat radiation member 410. The second protective layer 120 attached onto the first surface of the heat radiation member 410 can improve the heat transfer characteristics and/or durability of the heat radiation sheet 1000. In addition, for example, even when the heat radiation member 410 is made of a material that is susceptible to damage in the third direction Z and is easily peeled off, the second protective layer 120 can improve the internal adhesion in the vicinity of the first surface (the upper surface in the drawings) of the heat radiation member 410 facing the second protective layer 120 and give excellent physical and mechanical properties to the heat radiation sheet 1000.

The protrusions 230*b* of the third adhesive member 230 may protrude from the base portion 230*a* to the first side (the lower side in the drawings) in the third direction Z. The protrusions 230*b* may be arranged on a plane in a form corresponding to the arrangement of in the first through fourth through holes 410*h*, 220*h*, 310*h* and 210*h* and may fill the first through fourth through holes 410*h*, 220*h*, 310*h* and 210*h*.

The protrusions 230*b* of the third adhesive member 230 may be inserted into the first through fourth through holes 410*h*, 220*h*, 310*h* and 210*h* to be in direct contact with the inner walls of the first through fourth through holes 410*h*, 220*h*, 310*h* and 210*h* and the first surface (the upper surface in the drawings) of the first protective layer 110. That is, the protrusions 230*b* of the third adhesive member 230 may contact all of the heat radiation member 410, the second adhesive member 220, the support member 310, the first adhesive member 210, and the first protective layer 110. For example, the protrusions 230*b* of the third adhesive member 230 may have a adhesive interface with each of the first adhesive member 210 and the second adhesive member 220. The adhesive interface between the protrusions 230*b* and the first adhesive member 210 and/or the adhesive interface between the protrusions 230b and the second adhesive member 220 may be aligned in the third direction Z with respect to an adhesive interface between the protrusions 230b and the heat radiation member 410. The adhesive interface may refer to a physical boundary, but may not be visible.

The third adhesive member 230 attached to the inner walls of the first through fourth through holes 410h, 220h, 310h and 210h and the first protective layer 110 can improve the durability of the heat radiation sheet 1000. In addition, for example, even when the heat radiation member 410 is made of a material that is susceptible to damage in the third direction Z and is easily peeled off, since the protrusions 230b of the third adhesive member 230 are coupled to the inner walls of the first through holes 410h penetrating the heat radiation member 410, the internal adhesion inside the heat radiation member 410 can be at least partially improved, and excellent physical and mechanical properties can be given to the heat radiation sheet 1000.

A heat radiation sheet according to embodiments described with reference to FIGS. 1 and 2 and below can be cut into an appropriate size and shape before being attached to a product. In this case, the heat radiation sheet may be cut and placed such that each planar quadrant of the cut heat radiation sheet partially includes at least one through hole. This can further improve the peeling property of the heat radiation sheet when the heat radiation sheet is made into a product.

Other embodiments of the inventive concept will hereinafter be described.

Figure 3:
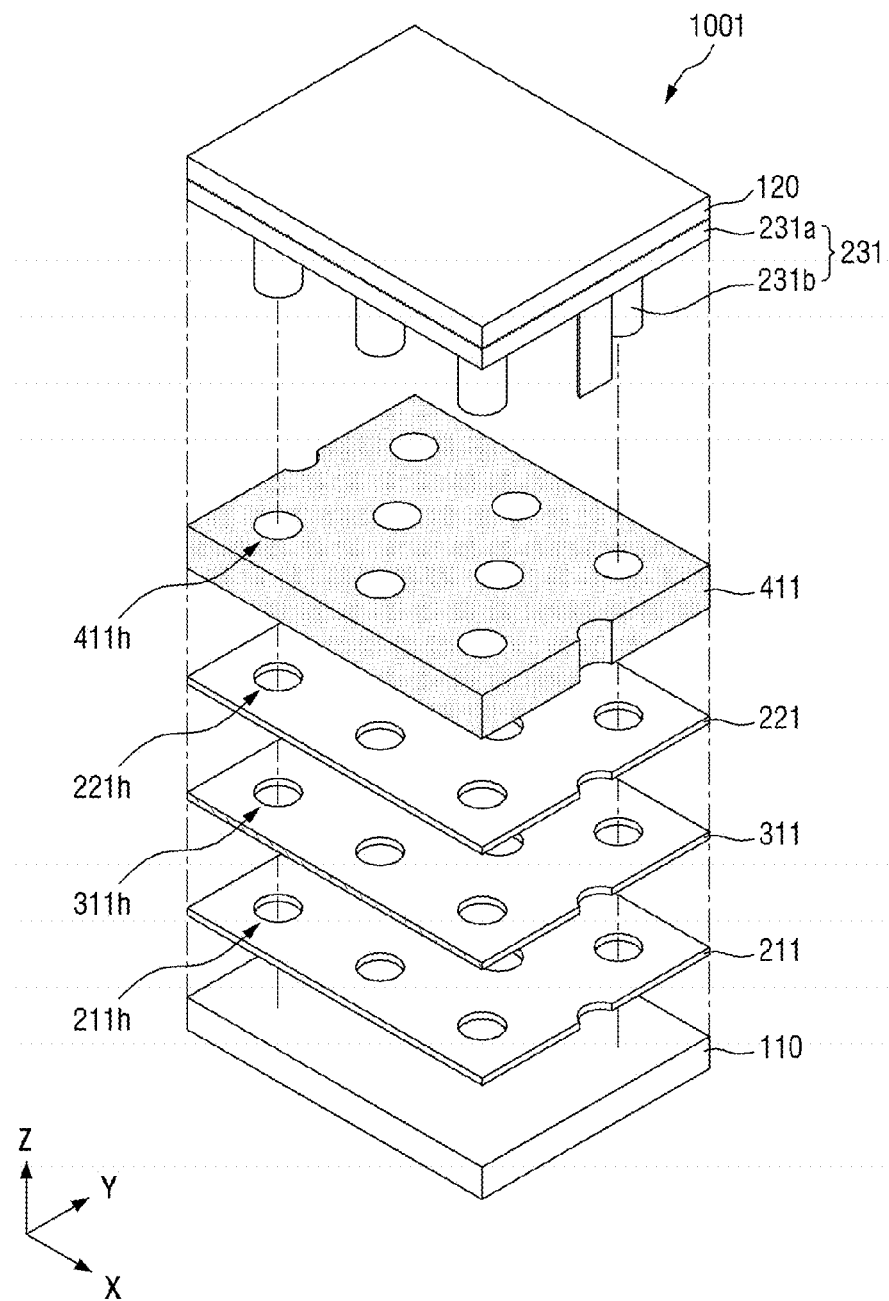
FIG. 3 is an exploded perspective view of a heat radiation sheet according to an embodiment.

FIG. 3 is an exploded perspective view of a heat radiation sheet 1001 according to an embodiment.

Referring to FIG. 3, the heat radiation sheet 1001 according to the current embodiment is different from the heat radiation sheet 1000 according to the embodiment of FIG. 1 in that first through holes 411h of a heat radiation member 411, second through holes 221h of a second adhesive member 221, third through holes 311h of a support member 311 and fourth through holes 211h of a first adhesive member 211 are regularly arranged on a plane but are separated from each other in a first direction X and a direction at an acute angle to the first direction X. In addition, the planar arrangement of protrusions 231b of a third adhesive member 231 may correspond to that of the first through fourth through holes 411h, 221h, 311h and 211h.

Figure 4:
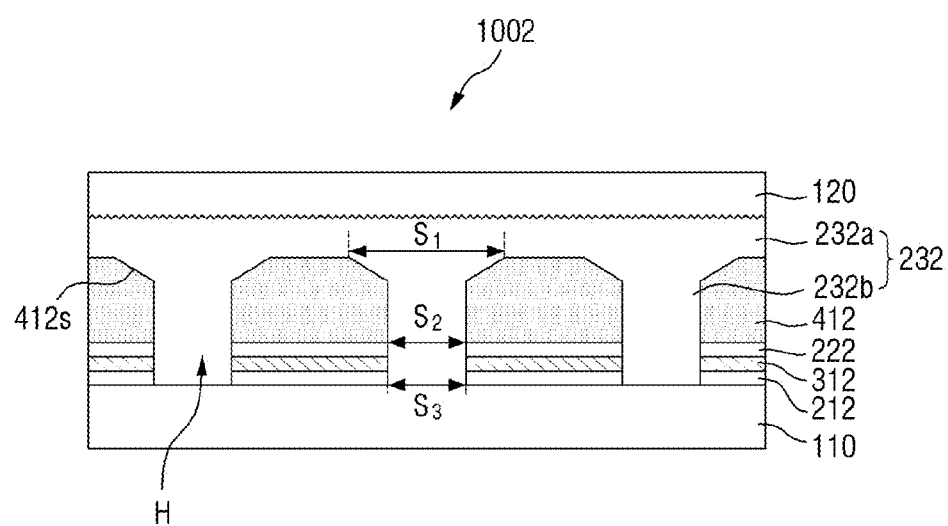
FIGS. 4 through 6 are cross-sectional views of heat radiation sheets according to embodiments.

FIG. 4 is a cross-sectional view of a heat radiation sheet 1002 according to an embodiment.

Referring to FIG. 4, the heat radiation sheet 1002 according to the current embodiment is different from the heat radiation sheet 1000 according to the embodiment of FIG. 1 in that a heat radiation member 412, a second adhesive member 222, a support member 312, and a first adhesive member 212 have one or more continuous through holes H extending in a third direction (a thickness direction), but an inner wall of each of the through holes H at least partially includes an inclined portion 412s.

A first end (an upper end in the drawing) of each through hole of the heat radiation member 412 facing a third adhesive member 232 partially includes the inclined portion 412s. In FIG. 4, the inclined portion 412s is a flat downwardly inclined surface. In other embodiments, however, the inclined portion 412s may slope downward in an upwardly or downwardly convex shape in the drawing with a predetermined curvature. An inner wall of a second end (a lower end in the drawing) of each through hole of the heat radiation member 412 facing the second adhesive member 222 may be substantially perpendicular.

In an exemplary embodiment, a planar area $S_1$ of each through hole of the heat radiation member 412 in a first surface an upper surface in the drawing) of the heat radiation member 412 facing the third adhesive member 232 may be greater than a planar area Sof each through hole of the heat radiation member 412 in a second surface (a lower surface in the drawing) of the heat radiation member 412 facing the second adhesive member 222. That is, the planar area of each through hole of the heat radiation member 412 may be reduced from a second protective layer 120 toward a first protective layer 110. This may make it easy to form protrusions 232b of the third adhesive member 232 in the method of manufacturing a heat radiation sheet which will be described later.

The inner walls of the through holes of the second adhesive member 222, the support member 312 and the first adhesive member 212 may be substantially perpendicular. That is, the planar areas of the through holes of the second adhesive member 222, the support member 312 and the first adhesive member 212 may be substantially uniform regardless of position in the third direction (the thickness direction). In other words, the planar area of each through hole of the second adhesive member 222 in a first surface of the second adhesive member 222 facing the heat radiation member 412 may be substantially equal to the planar area $S_2$ of each through hole 412h of the heat radiation member 412 facing the second adhesive member 222.

In addition, a planar area of each through hole of the second adhesive member 222 in the first surface (an upper surface in the drawing) of the second adhesive member 222 facing the heat radiation member 412 may be substantially equal to a planar area $S_3$ of each through hole of the first adhesive member 212 in a second surface (a lower surface in the drawing) of the first adhesive member 212 facing the first protective layer 110.

Figure 5:
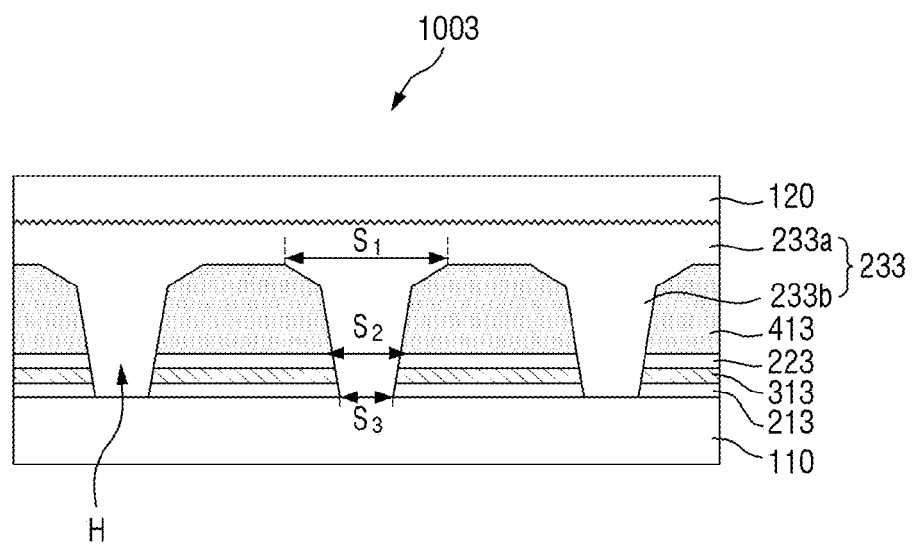

FIG. 5 is a cross-sectional view of a heat radiation sheet 1003 according to an embodiment.

Referring to FIG. 5, the heat radiation sheet 1003 according to the current embodiment is different from the heat radiation sheet 1002 according to the embodiment of FIG. 4 in that a heat radiation member 413, a second adhesive member 223, a support member 313, and a first adhesive member 213 have one or more continuous through holes H extending in a third direction (a thickness direction), but an inner wall of each of the through holes H includes an inclined surface. In FIG. 5, the inclined surface is a flat downwardly inclined surface. In other embodiments, however, the inclined surface may slope downward in an upwardly or downwardly convex shape in the drawing with a predetermined curvature.

The inner wall of each of the continuous through holes H may include a continuous inclined surface. That is, due to the inclined surface of the inner wall of each of the through holes H, the planar area of each of the through holes H may vary according to position in the third direction (the thickness direction). For example, the planar area of each through hole H may be reduced from a second protective layer 120 toward a first protective layer 110. In an exemplary embodiment, the planar area of each through hole in a first surface (an upper surface in the drawing) of each of the heat radiation member 413, the first adhesive member 213, the second adhesive member 223 and the support member 313 may he greater than that of each through hole in a second surface (a lower surface in the drawing).

For example, a planar area $S_1$ of each through hole of the heat radiation member 413 in the first surface (the upper surface in the drawing of the heat radiation member 413 facing a third adhesive member 233 may be greater than a planar area $S_2$ of each through hole of the heat radiation member 413 in the second surface (the lower surface in the drawing) of the heat radiation member 413 facing the second adhesive member 223.

In addition, the planar area $S_2$ of each through hole 413h of the heat radiation member 413 in the second surface of the heat radiation member 413 facing the second adhesive member 223 may be substantially equal to a planar area of each through hole of the second adhesive member 223 in the first surface (the upper surface in the drawing) of the second adhesive member 223 facing the heat radiation member 413.

Furthermore, a planar area of each through hole of the second adhesive member 223 in the first surface of the second adhesive member 223 facing the heat radiation member 413 may be greater than a planar area $S_3$ of each through hole of the first adhesive member 213 in the second surface (the lower surface in the drawing) of the first adhesive member 213 facing the first protective layer 110.

Figure 6:
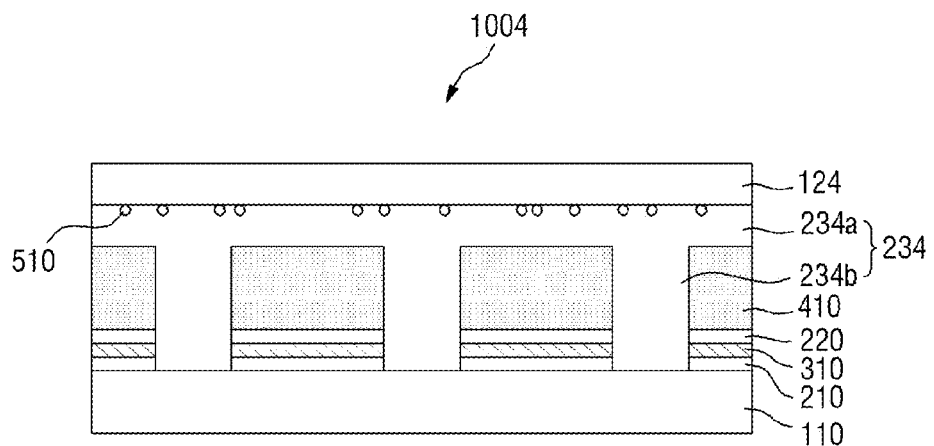

FIG. 6 is a cross-sectional view of a heat radiation sheet 1004 according to an embodiment.

Referring to FIG. 6, the heat radiation sheet 1004 according to the current embodiment is different from the heat radiation sheet 1000 according to the embodiment of FIG. 1 in that it further includes a metal particle layer 510 disposed on a second surface (a lower surface in the drawing) of a second protective layer 124 facing a third adhesive member 234.

In an exemplary embodiment, the surface roughness of the second surface of the second protective layer 124 facing the third adhesive member 234 may be substantially equal to the surface roughness of a first surface (an upper surface in the drawing) of a first protective layer 110 facing a first adhesive member 210.

The metal particle layer 510 may be attached to the second surface of the second protective layer 124. In addition, the metal particle layer 510 may protrude from the second surface of the second protective layer 124 to form projections. The metal particle layer 510 may be made of thermally conductive particles, copper (Cu), cobalt (Co), nickel (Ni), iron (Fe), tin (Sn), zinc (Zn), indium (In), tungsten (W), an alloy of the same, or metal particles containing an oxide of the same. The surface roughness of an attachment surface of the second protective layer 124 which is attached using a composition for forming an adhesive member may become relatively greater due to the projections formed by the metal particle layer 510 disposed on the second surface of the second protective layer 124.

A method of manufacturing a heat radiation sheet according to the inventive concept will hereinafter be described.

FIGS. 7 through 13 are views illustrating a method of manufacturing a heat radiation sheet according to an embodiment.

Figure 7:
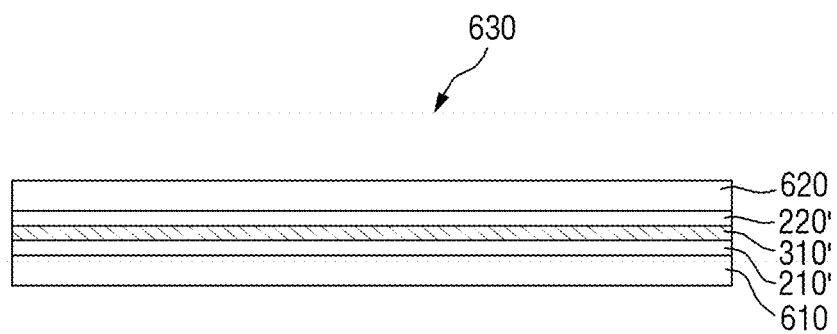
FIGS. 7 through 13 are views illustrating a method of manufacturing a heat radiation sheet according to an embodiment.

Referring to FIG. 7, an adhesive member 630 including a first release member 610, a first adhesive member 210' disposed on the first release film 610, a support member 310' disposed on the first adhesive member 210', a second adhesive member 220' disposed on the support member 310', and a second release film 620 disposed on the second adhesive member 220' is prepared. In an exemplary embodiment, the adhesive member 630 may be a double-sided adhesive member including the first adhesive member 210' and the second adhesive member 220' made of thermosetting resin. The first adhesive member 210', the support member 310' and the second adhesive member 220' are the same as the first adhesive member 210, the support member 310 and the second adhesive member 220 of FIG. 1 except that no through holes are formed in each of the first adhesive member 210', the support member 310' and the second adhesive member 220'. Therefore, a detailed description of the first adhesive member 210', the support member 310' and the second adhesive member 220' will be omitted.

Figure 8:
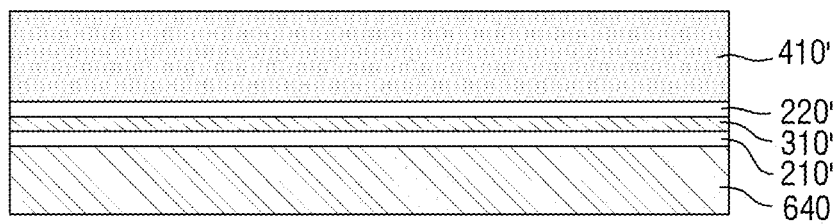

Referring to FIGS. 7 and 8, the first and second release films 610 and 620 are removed. Then, a carrier film 640 is placed on a second surface (a lower surface in the drawings) of the first adhesive member 210', and a heat radiation member 410' is placed on a first surface (an upper surface in the drawings) of the second adhesive member 220'. In an exemplary embodiment, the placing of the carrier film 640 and the heat radiation member 410' may be performed using a roll-to-roll process. The carrier film 640 may be a polymer film such as polyethylene terephthalate. The heat radiation member 410' is the same as the heat radiation member 410 of FIG. 1 except that no through holes are formed in the heat radiation member 410'. Therefore, a detailed description of the heat radiation member 410' will be omitted. In an embodiment, the first release film 610 may not be removed and may be used together with the carrier film.

Figure 9:
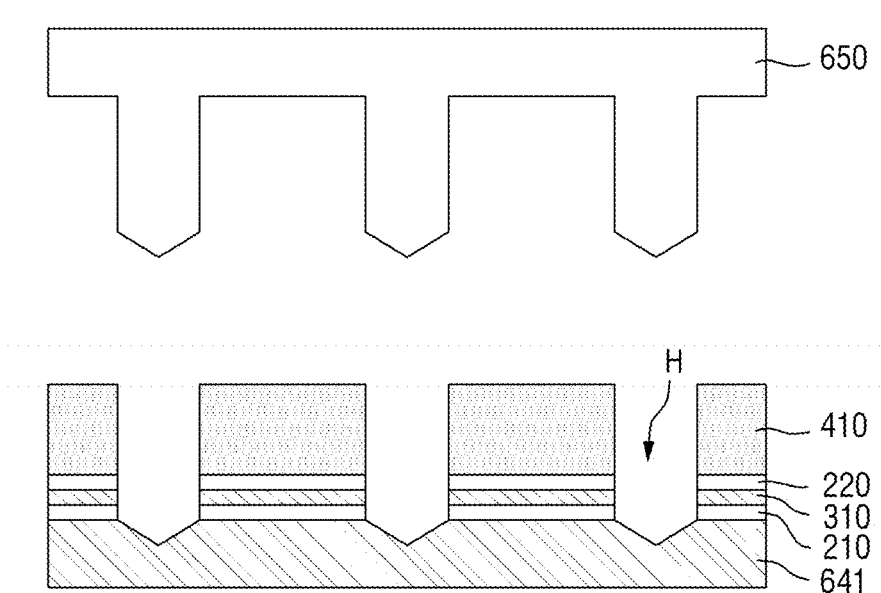
Figure 10:
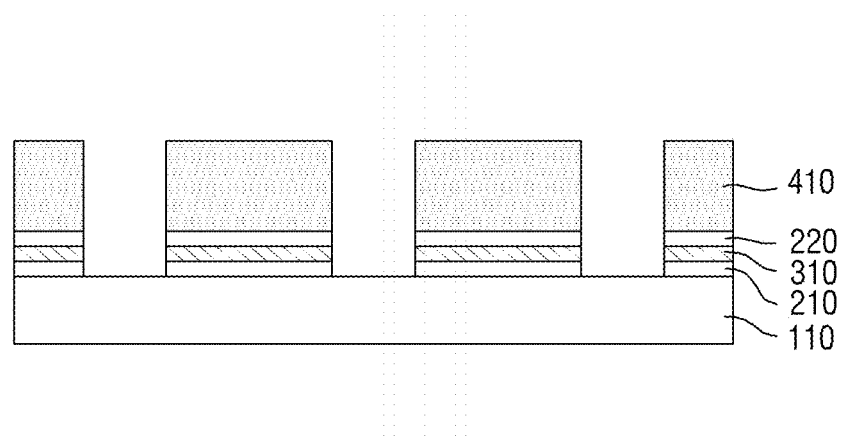
Figure 11:
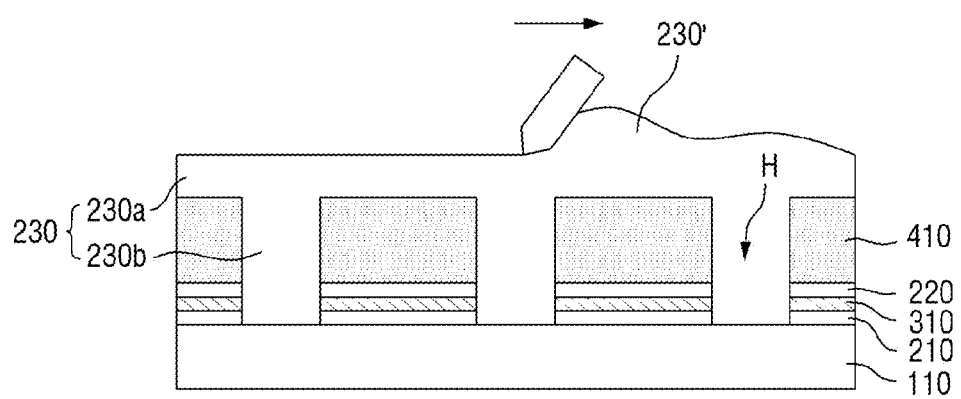
Figure 12:
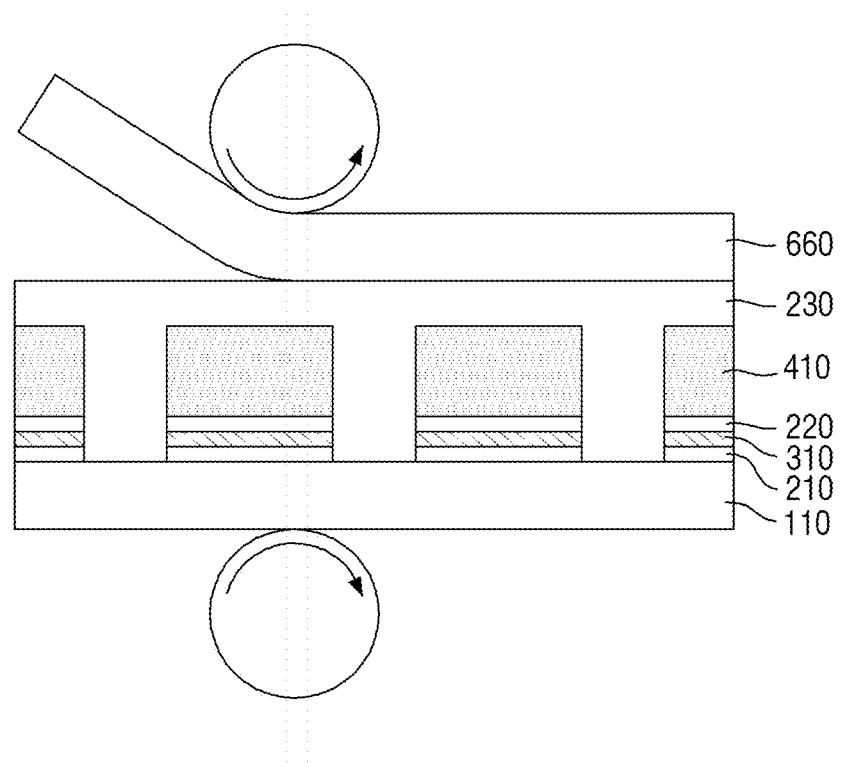
Figure 13:
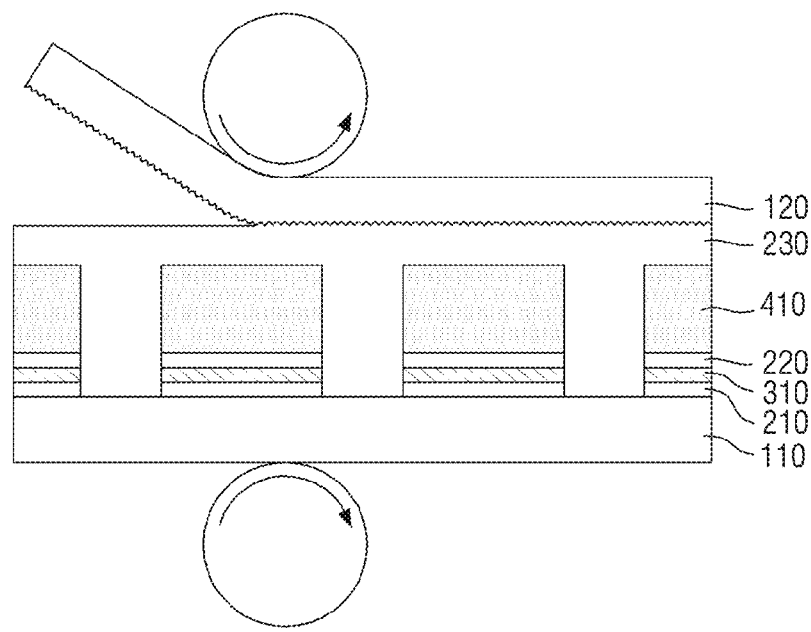

Referring to FIGS. 7 through 9, one or more through holes H are formed in each of the heat radiation member 410, the second adhesive member 220, the support member 310, and the first adhesive member 210. The forming of the through holes H may be an operation of perforating the heat radiation member 410, the second adhesive member 220, the support member 310 and the first adhesive member 210 using a mold 650 having a shape corresponding to the through holes H. In an exemplary embodiment, grooves may be formed in at least part of a first surface (an upper surface in the drawing) of the carrier film 641.

In particular, even when the heat radiation member 410 has a brittle characteristic and the first adhesive member 210 and the second adhesive member 220 have flexible characteristics, it is possible to easily form through holes having a uniform shape and depth without increasing the overall thickness by placing the relatively rigid support member 310 between the first adhesive member 210 and the second adhesive member 220.

Referring to FIGS. 7 through 10, the carrier film 641 is removed, and a first protective layer 110 is placed on the second surface (the lower surface in the drawing) of the first adhesive member 210. In an exemplary embodiment, the placing of the first protective layer 110 may be performed using a roll-to-roll process. Since the first protective layer 110 has been described above with reference to FIG. 1, a detailed description of the first protective layer 110 will be omitted.

Referring to FIGS. 7 through 11, a third adhesive member 230 is formed on the heat radiation member 410. The forming of the third adhesive member 230 may be an operation of placing the third adhesive member 230 to contact all of the first protective layer 110, the first adhesive member 210, the support member 310, the second adhesive member 220 and the heat radiation member 410.

In an exemplary embodiment, the placing of the third adhesive member 230 may include providing a composition 230' for forming a third adhesive member on a first surface of the heat radiation member 410, filling the through holes H formed in the heat radiation member 410, the second adhesive member 220, the support member 310 and the first adhesive member 210 with the composition 230', and forming the third adhesive member 230, which includes a base portion 230a contacting the first surface of the heat radiation member 410 and protrusions 230b protruding from the base portion 230a and inserted into the through holes H, by curing the composition 230'.

The composition 230' for forming a third adhesive member may be a photocurable resin composition having a shrinkage ratio of 5% or less. Therefore, the volume of the composition 230' lost during a curing process can be minimized, thereby enabling the protrusions 230b of the third adhesive member 230 to be fully inserted into the through holes H and preventing a heat radiation sheet from being warped or twisted after the curing process. The base portion 230a of the third adhesive member 230 may contact and adhere to the first surface (the upper surface in the drawings) of the heat radiation member 410, and the protrusions 230h of the third adhesive member 230 may be inserted into the through holes H to contact and adhere to inner walls of the through holes H and a first surface of the first protective layer 110. That is, the protrusions 230b may contact all of the heat radiation member 410, the second adhesive member 220, the support member 310, the first adhesive member 210 and the first protective layer 110. Since the third adhesive member 230 has been described above with reference to FIG. 1, a detailed description of the third adhesive member 230 will be omitted.

Next, referring to FIGS. 7 through 12, a third release film 660 is placed on and pressed against a first surface (an upper surface in the drawings) of the third adhesive member 230. In an exemplary embodiment, the placing and pressing of the third release film 660 may be performed using a roll-to-roll process.

The placing and pressing of the third release film 660 may be an operation of increasing the adhesion between the first protective layer 110, the first adhesive member 210, the support member 310, the second adhesive member 220, the third adhesive member 230 and the third release film 660 by pressing them. Accordingly, the durability of a heat radiation sheet manufactured can be improved. However, in some embodiments, the placing and pressing of the third release film 660 may be omitted.

Referring to FIGS. 7 through 13, the first surface (the upper surface in the drawings) of the third adhesive member 230 is exposed by removing the third release film 660, and a second protective layer 120 is placed on the first surface of the third adhesive member 230. In an exemplary embodiment, the removing of the third release film 660 and the placing of the second protective layer 120 may be performed using a roll-to-roll process. A second surface (a lower surface in the drawings) of the second protective layer 120 facing the third adhesive member 230 may have a certain surface roughness. The surface roughness of the second surface of the second protective layer 120 may be formed using a chemical method. For example, the surface roughness of the second surface of the second protective layer 120 may be formed by etching the second surface of the second protective layer 120 using an acid. When a chemical method is used, a fine and uniform uneven surface can be formed. Since the second protective layer 120 has been described above with reference to FIG. 1, a detailed description of the second protective layer 120 will be omitted.

The method of manufacturing a heat radiation sheet according to the current embodiment is performed using a roll-to-roll process. Therefore, the manufacturing process can be simplified, and the manufacturing cost can be reduced. Also, since the roll-to-roll process is used, a large-sized heat radiation sheet, instead of a sheet of a unit size, can be manufactured and then cut for use.

Hereinafter, the inventive concept will be described in more detail by way of Example and Experimental Example.

<Example>

Figure 14:
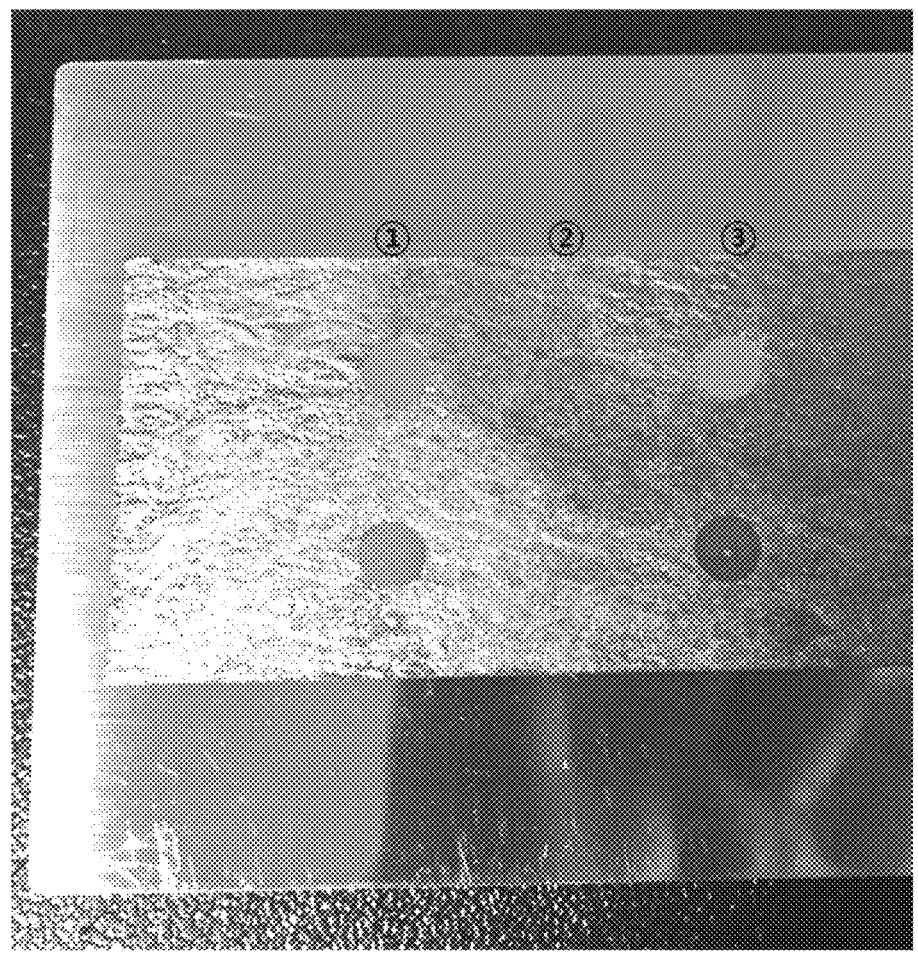
FIG. 14 is a photograph of a heat radiation sheet manufactured according to Example.

A heat radiation sheet was manufactured using a 9 μm-thick copper thin film as first and second protective layers and a 17 μm-thick graphite film as a heat radiation member. Each through hole of the heat radiation sheet had a diameter of 4 mm, a horizontal distance between the through holes was 20 mm, and a vertical distance between the through holes was 10 mm. FIG. 14 is a planar photograph of the heat radiation sheet manufactured according to Example and then cut into a size of 130 mm ×25 mm.

<Experimental Example: peel strength test>

Figure 15:
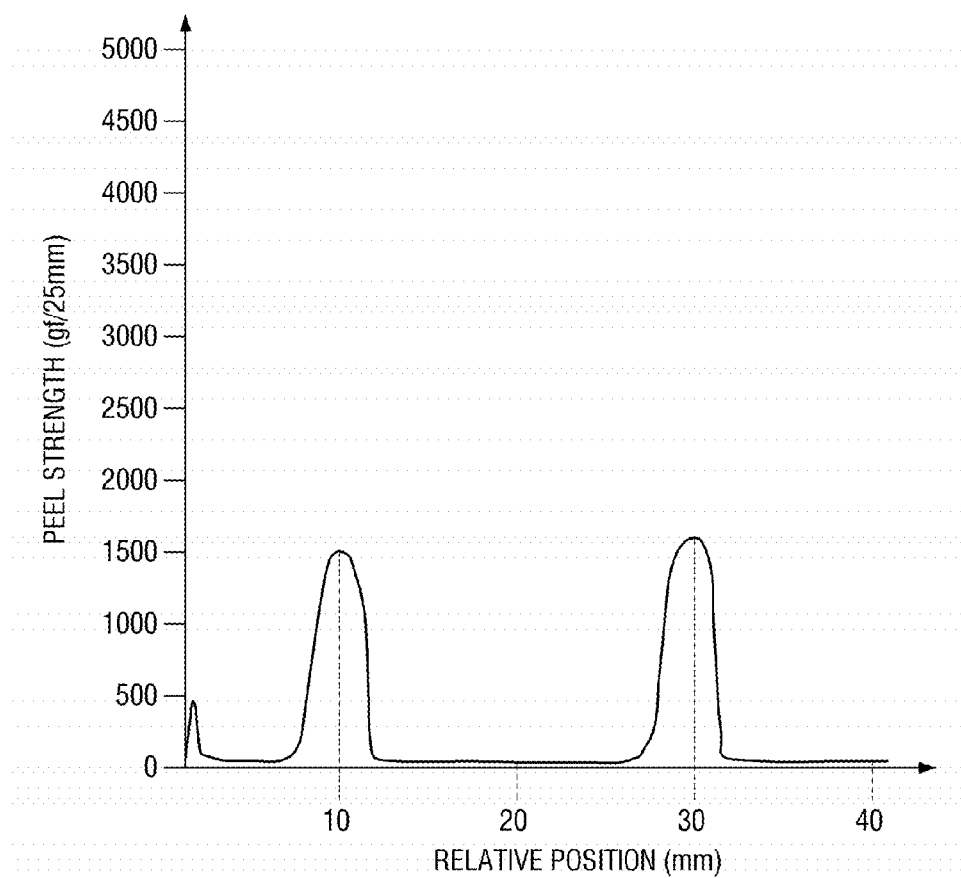
FIG. 15 illustrates the results of Experimental Example.

After a lower protective layer (e.g., the first protective layer of FIG. 1) of the heat radiation sheet manufactured according to Example was removed, a lowermost adhesive layer (e.g., the first adhesive member of FIG. 1) of the heat radiation sheet was attached to a stainless steel substrate (SUS304). Then, at room temperature, a horizontal end of the stainless steel substrate was pulled to one side, and at the same time, a corresponding horizontal end of the heat radiation sheet was pulled to the other side to peel off the heat radiation sheet. In this way, a 180-degree peel strength test was conducted, and the results are illustrated in FIG. 15. Here, the peeling speed was 300 mm/min.

In FIG. 15, the horizontal axis indicates relative position in the heat radiation sheet in a horizontal direction, and the vertical axis indicates peel strength at each position in the heat radiation sheet. Referring to FIG. 15, the peel strength is about 1500 gf/25 mm at a 10 mm position (corresponding to ① in FIG. 14) and a 30 mm position (corresponding to ③ in FIG. 14) corresponding to through holes but is about 30 gf/25 mm at, e.g., a 20 mm position (corresponding to ② in FIG. 14) at which no through holes are formed. This may be because an adhesive member (e.g., the protrusions of the third adhesive member of FIG. 1) inserted into the through holes and extending in a thickness direction serves as a stopper in the peeling process. That is, the adhesive member inserted into the through holes penetrating the heat radiation member significantly improves the peel strength of at least part of the heat radiation sheet. In other words, the adhesive members (e.g., the first through third adhesive members of FIG. 1) can suppress a peeling defect of the heat radiation member in the thickness direction.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should he considered in a descriptive sense only and not for purposes of limitation.

What is claimed is:

1. A heat radiation sheet comprising:
   a first protective layer;
   a first adhesive member which is disposed on the first protective layer and has one or more through holes;
   a support member which is disposed on the first adhesive member and has one or more through holes;
   a second adhesive member which is disposed on the support member and has one or more through holes;
   a heat radiation member which is disposed on the second adhesive member and has one or more through holes; and
   a third adhesive member which is disposed on the heat radiation member and comprises a base portion contacting a first surface of the heat radiation member and protrusions protruding from the base portion and inserted into the through holes of the heat radiation member, the through holes of the second adhesive member, the through holes of the support member and the through holes of the first adhesive member, wherein the protrusions of the third adhesive member are at least partially coupled to the first protective layer.

2. The heat radiation sheet of claim 1, wherein the through holes of the first adhesive member, the through holes of the support member, the through holes of the second adhesive member, and the through holes of the heat radiation member are connected to each other.

3. The heat radiation sheet of claim 2, wherein a thickness of the first protective layer is greater than a thickness of the support member and smaller than a thickness of the heat radiation member, a thickness of the base portion of the third adhesive member is greater than the sum of a thickness of the first adhesive member and a thickness of the second adhesive member, thermal conductivity of the heat radiation member in a horizontal direction is greater than thermal conductivity of the first protective layer, and the thermal conductivity of the first protective layer is greater than thermal conductivity of the support member.

4. The heat radiation sheet of claim 2, wherein the heat radiation member comprises a carbon material, and the first protective layer comprises copper (Cu), aluminum (Al), silver (Ag), gold (Au), carbon nanotubes, grapheme, or a polymer film.

5. The heat radiation sheet of claim 4, wherein the first adhesive member and the second adhesive member comprise thermosetting resin, and the third adhesive member comprises photocurable resin.

6. The heat radiation member of claim 4, wherein a modulus of the third adhesive member is greater than a modulus of the first adhesive member and a modulus of the second adhesive member.

7. The heat radiation member of claim 1, wherein the protrusions of the third adhesive member contact the first adhesive member.

8. The heat radiation member of claim 7, wherein the through holes of the heat radiation member are arranged regularly on a plane.

9. The heat radiation sheet of claim 1, wherein a planar area of each through hole of the heat radiation member in the first surface of the heat radiation member facing the third adhesive member is greater than a planar area of each through hole of the heat radiation member in a second surface of the heat radiation member facing the second adhesive member.

10. The heat radiation sheet of claim 9, wherein the planar area of each through hole of the heat radiation member in the second surface of the heat radiation member facing the second adhesive member is greater than a planar area of each through hole of the first adhesive member in a second surface of the first adhesive member facing the first protective layer.

11. The heat radiation sheet of claim 1, further comprising a second protective layer which is disposed on the third adhesive member, wherein gloss of a second surface of the second protective layer facing the third adhesive member is equal to gloss of a first surface of the first protective layer facing the first adhesive member.

12. The heat radiation sheet of claim 1, further comprising a second protective layer which is disposed on the third adhesive member, wherein gloss of a second surface of the second protective layer facing the third adhesive member is smaller than gloss of a first surface of the first protective layer facing the first adhesive member.

13. The heat radiation sheet of claim 1, further comprising:
a second protective layer which is disposed on the third adhesive member; and
a metal particle layer which is disposed on a second surface of the second protective layer facing the third adhesive member.

14. A heat radiation sheet comprising:
a protective layer;
a first adhesive member which is disposed on the protective layer and has one or more through holes;
a heat radiation member which is disposed on the first adhesive member and has one or more through holes; and
a second adhesive member which is disposed on the heat radiation member and comprises a base portion contacting a first surface of the heat radiation member and protrusions protruding from the base portion and inserted into the through holes of the heat radiation member and the through holes of the first adhesive member,
wherein the first adhesive member and the second adhesive member are made of different materials
wherein the protrusions of the second adhesive member are at least partially coupled to the protective layer.

15. A method of manufacturing a heat radiation sheet, the method comprising:
preparing a carrier film, a first adhesive member disposed on a first surface of the carrier film, and a heat radiation member disposed on a first surface of the first adhesive member;
forming one or more through holes in each of the heat radiation member and the first adhesive member;
removing the carrier film and placing a first protective layer on a second surface of the first adhesive member; and
placing a second adhesive member on the heat radiation member such that the second adhesive member contacts the first protective layer and the heat radiation member,
wherein the second adhesive member is at least partially coupled to the first protective layer.

16. The method of claim 15, wherein the placing of the second adhesive member comprises:
providing a composition for forming the second adhesive member on a first surface of the heat radiation member;
filling the through holes of the heat radiation member with the composition; and
forming the second adhesive member by curing the composition.

17. The method of claim 15, further comprising:
placing a release film on the first surface of the second adhesive member;
pressing the first protective layer, the first adhesive member, the heat radiation member, the second adhesive member, and the release film;
exposing the first surface of the second adhesive member by removing the release film; and
placing a second protective layer on the first surface of the second adhesive member,
wherein the placing of the release film, the pressing of the release film, the removing of the release film, and the placing of the second protective layer are performed using a roll-to-roll process.

* * * * *